United States Patent [19]
Noda et al.

[11] Patent Number: 6,097,746
[45] Date of Patent: Aug. 1, 2000

[54] LASER DIODE PROTECTING CIRCUIT

[75] Inventors: Mitsuharu Noda, Fukuoka; Motoyoshi Sekiya, Kawasaki; Setsuo Misaizu, Yokohama; Tetsuya Kiyonaga, Kawasaki, all of Japan

[73] Assignee: Fujitsu Limited, Kawasaki, Japan

[21] Appl. No.: 09/041,752

[22] Filed: Mar. 13, 1998

[30] Foreign Application Priority Data

Oct. 16, 1997 [JP] Japan .................................. 9-283633

[51] Int. Cl.$^7$ ...................................................... H01S 3/00
[52] U.S. Cl. .............................................. 372/38; 372/34
[58] Field of Search ................................. 372/38, 34, 31

[56] References Cited

U.S. PATENT DOCUMENTS

| 4,789,987 | 12/1988 | Fraser ......................................... 372/38 |
| 4,819,241 | 4/1989 | Nagano ...................................... 372/38 |
| 5,019,769 | 5/1991 | Levinson ................................... 372/31 |
| 5,276,697 | 1/1994 | Davis ......................................... 372/34 |
| 5,499,258 | 3/1996 | Kawano et al. .......................... 372/34 |

FOREIGN PATENT DOCUMENTS 61-63074  4/1986  Japan .

*Primary Examiner*—Leon Scott, Jr.
*Attorney, Agent, or Firm*—Staas & Halsey LLP

[57] ABSTRACT

Disclosed is a laser diode protecting circuit adapted to prevent a laser diode from producing an excessive emission when the laser diode is driven at low temperature, thereby assuring that the laser diode will not be damaged or degraded in terms of its characteristic. When the laser diode is started at low temperature, a laser diode protecting circuit has a power monitor circuit for monitoring backward power of the laser diode and a laser diode current limiting circuit for limiting the laser diode current when the backward power becomes equal to the set power. When the laser diode temperature subsequently rises and the backward power falls below the set power, an automatic current control circuit performs automatic current control in such a manner that the laser diode current attains a set current value. Alternatively, a temperature monitor circuit monitors the temperature of the laser diode and the laser diode current limiting circuit limits the laser diode current when the monitored temperature of the laser diode is less than the set temperature. When the laser diode temperature exceeds the set temperature, the automatic current control circuit performs automatic current control in such a manner that the laser diode attains the set current value.

9 Claims, 16 Drawing Sheets

LASER DIODE PROTECTING CIRCUIT

BACKGROUND OF THE INVENTION

This invention relates a laser diode protecting circuit in a laser diode drive having an automatic current control circuit (ACC circuit) for performing control in such a manner that laser diode current attains a set value. More particularly, the invention relates to a laser diode protecting circuit for protecting a laser diode by preventing an excessive emission from the laser diode when the laser diode is started up at low temperatures.

A deterioration in transmission characteristics due to wavelength fluctuation (chirping) cannot be ignored in high-speed optical communications. In addition, wavelength stability is extremely important in wavelength division multiplexing. For these reasons the laser diode drive is constructed by combining an ACC circuit and an ATC (Automatic Temperature Control) circuit and control is performed in such a manner that the laser diode current will attain a constant current value and the laser diode chip temperature (laser diode temperature) a constant temperature.

FIG. 15 is a block diagram illustrating an optical transmitter used in digital optical communication. The transmitter includes a laser diode drive 1 having a laser diode (LD) 1a, an ACC circuit 2 for performing control in such a manner that the laser diode current attains a set current value and an ATC circuit 3 for performing control in such a manner that the laser diode temperature attains a set value, optical fibers 4, 5, a D-type flip-flop (D-FF) 6 for passing a data signal DATA in response to a clock CLK, and a drive circuit (DRV) 7 for a light intensity modulator (IM) 8, which modulates light intensity in accordance with the "1", "0"logic of the data.

FIG. 16 shows an example of the ACC circuit 2. The laser diode (LD) is indicated at 1a. The ACC circuit 2 includes resistors R1~R3 having resistance values $r_1$~$r_3$, respectively, a transistor TR1 and a comparator (Op Amp) IC1 constituted by an operational amplifier. The laser diode 1a, transistor TR1 and resistor R1 are serially connected. If id represents a current that flows through the laser diode 1a, then id.$r_1$ will enter the inverting input terminal of the comparator IC1. On the other hand, a reference voltage $V_{REF}$, obtained by voltage division by the resistors R2, R3, enters the non-inverting input terminal of the comparator IC1. The ACC circuit 2 brings the laser diode current id into line with the set current value by controlling the on/off operation of the transistor TR1 in such a manner that the terminal voltage id.$r_1$ across the resistor R1 becomes equal to the reference voltage $V_{REF}$. More specifically, the voltage $V_{REF}$ obtained by voltage division by the resistors R2, R3 becomes the voltage across the resistor R1 and a value obtained by dividing this voltage by the resistance value $r_1$ becomes the current id that flows through the laser diode 1a. In other words, the base of the transistor TR1 is controlled by the comparator IC1 in such a manner that the resistor R1 will serve as a constant-current source the current value of which will be $V_{REF}/r_1$ at all times, thereby making it possible to obtain a constant current value even when the temperature varies.

FIG. 17 illustrates an example of the ATC circuit 3. The laser diode chip is shown at 1a. The ATC circuit includes a Peltier device 3a for heating or cooling the laser diode chip 1a depending upon the direction of the current, and a thermister 3b having a negative resistance characteristic for detecting the temperature of the laser diode chip 1a. The laser diode 1a, Peltier device 3a and thermister 3b are accommodated in a package 3c. The ATC circuit further includes resistors 3d, 3e, PNP, NPN transistors 3f, 3g and a comparator 3h. A voltage Vt (which conforms to the laser diode temperature) resulting from voltage division by the thermister 3b and resistor 3d is applied to the inverting input terminal of a comparator 3h, and a reference voltage $V_{ref}$ is applied to the non-inverting input terminal of the comparator 3h. The output terminal of the comparator is connected to the bases of transistors 3f, 3g. The emitter of the PNP transistor 3f is connected to V+, the emitter of the NPN transistor 3g is connected to V−, and the collectors of these transistors are connected to the Peltier device 3a.

When the laser diode chip is at a low temperature, the resistance of the thermister 3b increases, the voltage Vt decreases to establish the inequality Vt<Vref and the output of the comparator 3h becomes positive. As a result, the transistor 3f is turned off and the transistor 3g is turned on so that a current flows in a direction that causes the heating of the Peltier device 3a, thereby heating the interior of the package 3c and raising the temperature of the laser diode. When the temperature of the laser diode chip rises, the resistance of the thermister 3b decreases and the voltage Vt increases to establish the inequality Vt>Vref so that the output of the comparator 3g becomes negative. As a result, the transistor 3f is turned on and the transistor 3g is turned off so that a current flows in a direction that cools the Peltier device 3a, thereby lowering the temperature of the laser diode. The temperature of the laser diode is thus controlled so as to attain the set temperature.

When power is introduced to the optical transmitter of FIG. 15 at low temperatures to drive the laser diode 1a, the laser diode emits radiation excessively and the laser diode itself may be damaged. The reason for the excessive emission is as follows: The laser diode has a temperature characteristic of the kind shown in FIG. 18. It will be understood that the lower the temperature, the greater the power P needed to pass a constant laser diode current. If ACC stabilization time at which the laser diode current attains the set value by ACC is compared with stabilization at which the laser diode temperature attains the set value by ATC, it will be seen that ATC stabilization time is longer than ACC stabilization time. Consequently, when the laser diode is driven by introducing power at low temperature, the laser diode current attains the set value by ACC before the laser diode chip attains the fixed temperature owing to the delay involved in ATC, as a result of which the power of the emission from the laser diode increases and becomes so excessive as to degrade the characteristic of the laser diode and eventually destroy the same. In other words, though the laser diode current attains the target value owing to the ACC circuit, the laser diode temperature does not attain its target value. Accordingly, the laser diode produces an emission in excess of the target value.

SUMMARY OF THE INVENTION

Accordingly, an object of the present invention is to prevent an excessive emission from a laser diode when the laser diode is driven at low temperature, thereby assuring that damage to the laser diode and deterioration of its characteristics will not occur.

Another object of the present invention is to monitor emission power (backward power) of a laser diode to prevent an excessive emission from a laser diode when the laser diode is driven at low temperature, thereby assuring that damage to the laser diode and deterioration of its characteristics will not occur.

A further object of the present invention is to monitor time that elapses from introduction of power to prevent an excessive emission from a laser diode when the laser diode is driven at low temperature, thereby assuring that damage to the laser diode and deterioration of its characteristics will not occur.

In accordance with the present invention, the foregoing objects are attained by providing a laser diode protecting circuit of a laser diode drive having an automatic current control circuit for performing control in such a manner that laser diode current attains a set current value, comprising a power monitor circuit for monitoring emission power of a laser diode, and a laser diode current limiting circuit for halting automatic current control to limit laser diode current when the emission power exceeds a set value, and restoring automatic current control to make the laser diode current equal to the set current value when the emission power falls below the set value.

Further, in accordance with the present invention, the following objects are attained by providing a laser diode protecting circuit of a laser diode drive having an automatic current control circuit for performing control in such a manner that laser diode current attains a set current value, comprising a temperature monitor circuit for monitoring temperature of a laser diode, and a laser diode current limiting circuit for halting automatic current control to limit laser diode current when the temperature of the laser diode is less than a set temperature, and restoring automatic current control to make the laser diode current equal to the set current value when the temperature of the laser diode is greater than the set temperature.

Further, in accordance with the present invention, the following objects are attained by providing a laser diode protecting circuit of a laser diode drive having an automatic current control circuit for performing control in such a manner that laser diode current attains a set current value, comprising an elapsed-time monitor circuit for monitoring time that elapses from introduction of power, and a laser diode current limiting circuit for halting automatic current control to limit laser diode current when the time that elapses from introduction of power has not attained a set time, and restoring automatic current control to make the laser diode current equal to the set current value when the time that elapses from introduction of power has attained the set time.

Other features and advantages of the present invention will be apparent from the following description taken in conjunction with the accompanying drawings.

BRIEF DESCRIPTION OF THE DRAWINGS

DESCRIPTION OF THE PREFERRED EMBODIMENTS (A) Principles of the present invention (a) First principle of the present invention FIG. 1 is a block diagram useful in describing a first principle according to the present invention. Shown in FIG. 1 is a laser diode (LD) 11, an ACC circuit 12 for performing control in such a manner that the laser diode current attains a set current value, an ATC circuit 13 for performing control in such a manner that the laser diode temperature is rendered constant, an optical fiber 14, and a power monitor circuit 15 for monitoring emission power of the laser diode 11. The power monitor circuit 15 detects the backward power (BP) of the laser diode as the emission power thereof. A laser diode current limiting circuit 16 limits the current of the laser diode when the emission power exceeds a set power and includes a reference voltage generator 16a for outputting a reference voltage Vr conforming to set power, and a comparator 16b for comparing a voltage Vp, which conforms to detected emission power, with the reference voltage Vr.

When the laser diode is driven at low temperature and the laser diode current increases and approaches the set current value under ACC before the set temperature is attained owing to the lag associated with ATC, the emission power of the laser diode rises. When the emission power rises and surpasses the set power, the laser diode current limiting circuit 16 causes the ACC circuit 12 to halt ACC and limit the laser diode current, thereby preventing an excessive emission from the laser diode. If the temperature rises and the emission power of the laser diode falls below the set power owing to ATC under these conditions, the laser diode current limiting circuit 16 restores the ACC function of the ACC circuit 12 so that the laser diode current attains the set current value. As a result of the foregoing operation, the emission power (backward power) of the laser diode is monitored and excessive emission from the laser diode when the diode is driven at low temperatures is prevented so that the laser diode will not be damaged or sustain a deterioration in characteristics.

(b) Second principle of the present invention

Figure 1:
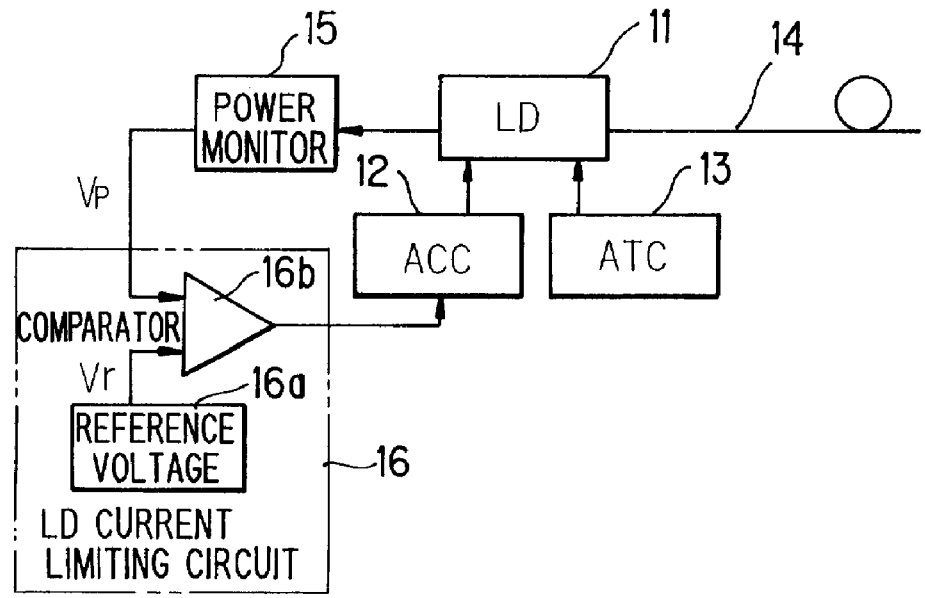
FIG. 1 is a block diagram useful in describing a first principle according to the present invention.
Figure 2:
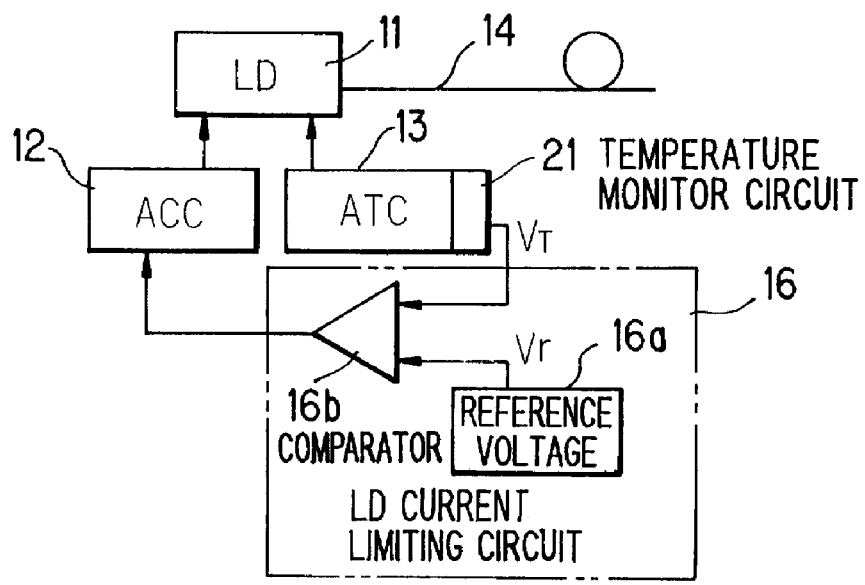
FIG. 2 is a block diagram useful in describing a second principle according to the present invention.

FIG. 2 is a block diagram useful in describing a second principle according to the present invention. Shown in FIG. 1 is the laser diode (LD) 11, the ACC circuit 12 for performing control in such a manner that the laser diode current attains a set current value, the ATC circuit 13 for performing control in such a manner that the laser diode temperature is rendered constant, the optical fiber 14, the laser diode current limiting circuit 16 for limiting the laser diode current when the laser diode temperature falls below the set temperature, and a temperature monitoring circuit 21 for monitoring the temperature of the laser diode chip. The laser diode current limiting circuit 16 includes the reference voltage generator 16a for outputting a reference voltage Vr conforming to set power, and the comparator 16b for comparing a voltage $V_T$, which conforms to detected temperature, with the reference voltage Vr.

When the laser diode is driven at low temperatures, the temperature of the laser diode initially is less than the set temperature. Consequently, the laser diode current limiting circuit 16 causes the ACC circuit 12 to halt ACC and limit the laser diode current, thereby preventing an excessive emission from the laser diode at low temperatures. If the temperature of the laser diode rises and exceeds the set temperature owing to ATC under these conditions, the laser diode 11 will not emit light excessively even though the laser diode current increases. The limiting circuit 16, therefore, restores the ACC function of the ACC circuit 12 so that the laser diode current attains the set current value. As a result of the foregoing operation, the laser diode temperature is monitored and excessive emission from the laser diode when the diode is driven at low temperatures is prevented so that the laser diode will not be damaged or sustain a deterioration in characteristics.

(c) Third principle of the present invention

Figure 3:
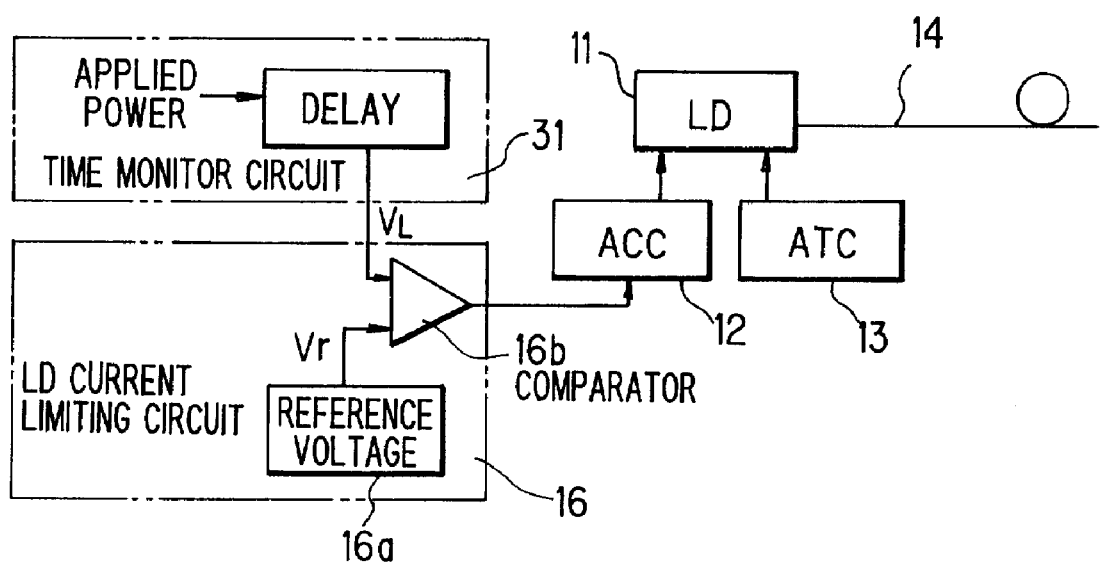
FIG. 3 is a block diagram useful in describing a third principle according to the present invention.

FIG. 3 is a block diagram useful in describing a third principle according to the present invention. Shown in FIG. 3 is the laser diode (LD) 11, the ACC circuit 12 for performing control in such a manner that the laser diode current attains a set current value, the ATC circuit 13 for performing control in such a manner that the laser diode temperature is rendered constant, the optical fiber 14, the laser diode current limiting circuit 16 for halting ACC to limit the laser diode current when time that elapses from introduction of power reaches a set time, and an elapsed-time monitor circuit 31 for monitoring time that elapses from introduction of power. For example, the elapsed-time monitor circuit 31 is constituted by a delay circuit (integrator circuit) in which output voltage $V_L$ increases as time elapses from the moment power is introduced. The laser diode current limiting circuit 16 includes the reference voltage generator 16a for outputting a reference voltage Vr conforming to set time, and the comparator 16b for comparing the voltage $V_L$, which conforms to the aforementioned elapsed time, with the reference voltage Vr. The laser diode current limiting circuit 16 halts ACC to limit the laser diode current until the elapsed time from introduction of power reaches the set value, thereby preventing an excessive emission from the laser diode. When the elapsed time surpasses the set time, the temperature rises owing to ATC and the laser diode 11 will not emit light excessively even though the laser diode current increases. The limiting circuit 16, therefore, restores the ACC function of the ACC circuit 12 so that the laser diode current is regulated to the set value. As a result of the foregoing operation, elapsed time from introduction of power is monitored and excessive emission from the laser diode when the diode is driven at low temperatures is prevented so that the laser diode will not be damaged or sustain a deterioration in characteristics.

Figure 4:
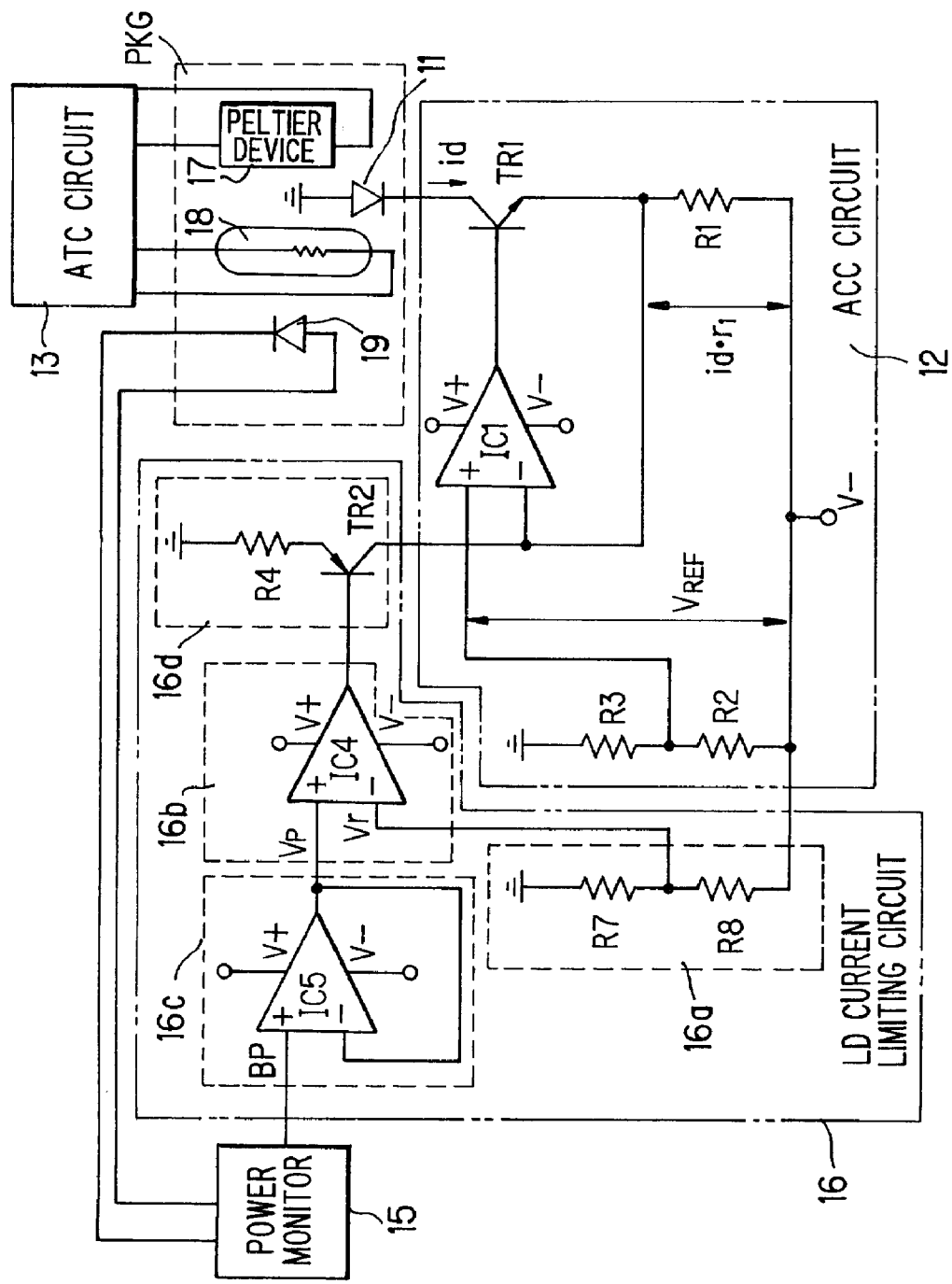
FIG. 4 is a diagram showing a first embodiment in which excessive emission is prevented by detecting emission power.

(B) Embodiments for preventing excessive emission by detecting emission power (a) First embodiment FIG. 4 is a diagram showing the construction of a first embodiment in which excessive emission is prevented by detecting emission power (backward power) of the laser diode 11. Components identical with those shown in FIG. 1 are designated by identical reference characters. The laser diode (LD) 11 is housed in a package PKG along with a Peltier device 17, a thermister 18 for detecting the temperature of the laser diode chip and a PIN photodiode 19 for detecting the backward power (optical intensity) of the laser diode.

The ACC circuit 12, which is for performing control in such a manner that the laser diode current will attain the set current value, has a construction identical with that of the ACC circuit shown in FIG. 16 and is connected to a current source 16d (described later) that passes a current into the resistor R1. If the backward power is less than the set power, there is no inflow of current from the current source 16d and therefore the ACC circuit 12 performs ACC in such a manner that the laser diode current id attains the set current value. If the backward power is greater than the set power, on the other hand, current flows into the resistor R1 from the current source 16d. Consequently, the ACC circuit 12 halts the ACC function and reduces the laser diode current id by an amount commensurate with the amount of current inflow, thereby limiting the current value of the laser diode.

Figure 17:
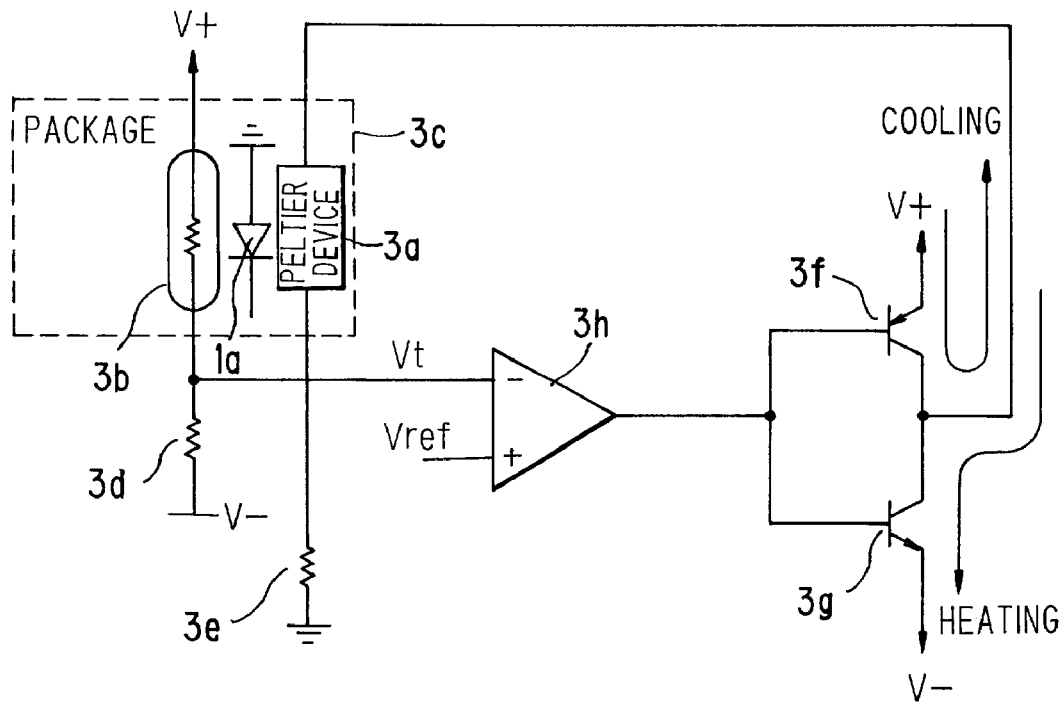
FIG. 17 is a diagram showing an example of an ATC circuit.
Figure 18:
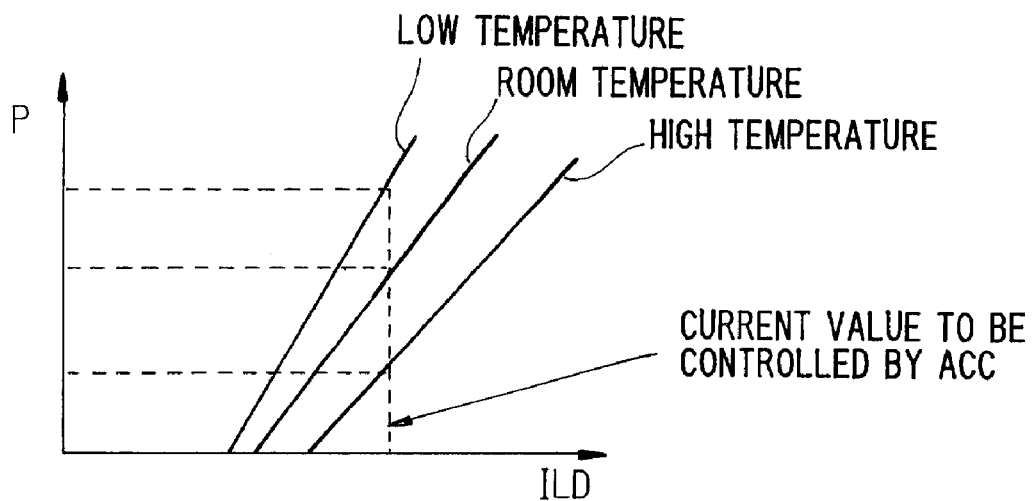
FIG. 18 is a diagram useful in describing the temperature characteristic of a laser diode.
Figure 19:
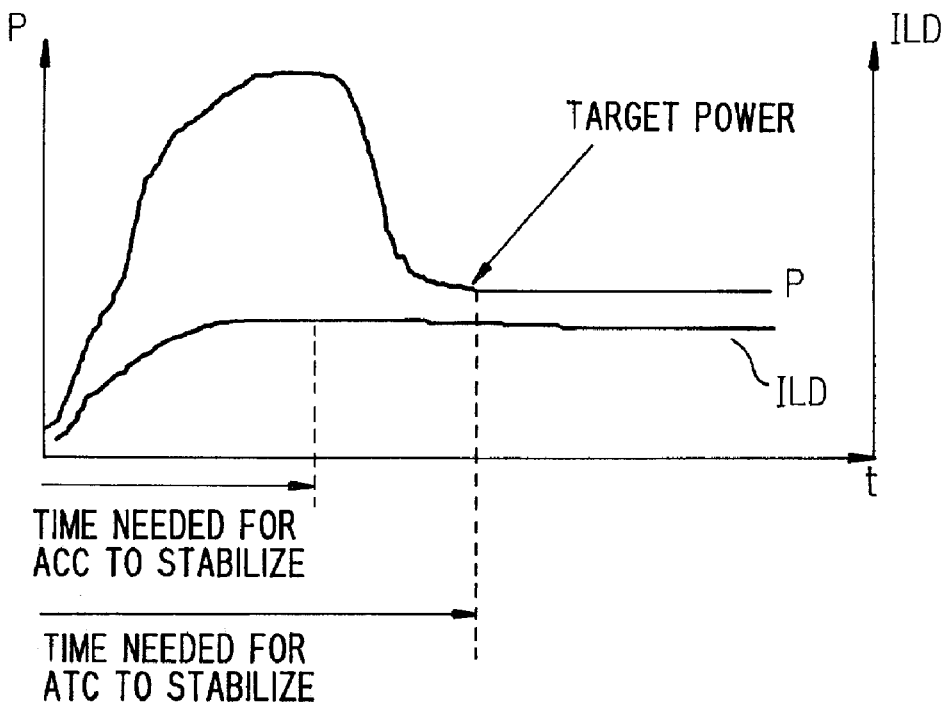
FIG. 19 is a diagram useful in describing the operation of a laser diode at low-temperature start-up.

The ATC circuit 13, which performs control in such a manner that the laser diode temperature is rendered constant, has a construction identical with that of the ATC circuit shown in FIG. 17. The power monitor circuit 15 uses the PIN photodiode 19 to output a voltage signal (referred to as a "backward power monitor signal BP") conforming to backward power. The laser diode current limiting circuit 16 limits the laser diode current when backward power exceeds the set power.

The laser diode current limiting circuit 16 includes the reference voltage generator 16a for outputting the reference voltage Vr through voltage division by resistors R7, R7, the comparator 16b constituted by an operational amplifier for comparing the voltage Vp dependent upon detected emission power (the larger the detected power, the smaller the voltage Vp) with the reference voltage Vr, a voltage follower circuit 16c and the current source 16d. The current source 16d has a transistor TR2 that turns on when the backward power is greater than the set power (i.e., when Vp<Vr holds) and turns off when the backward power is less than the set power (i.e., when Vp≦Vr holds), and a resistor R4 connected across the collector of transistor TR2 and ground. The emitter of the transistor TR2 is connected to the resistor R1 of ACC circuit 12.

By utilizing the fact that the forward power of the laser diode and the backward power BP of the laser diode are proportionally related, the reference voltage Vr is set in advance so as to attain a backward power monitor signal voltage corresponding to that which would prevail when the forward power is some multiple of the usual value.

When power is introduced to the laser diode drive circuit at low temperatures in the arrangement described above, the voltage Vp of the backward power monitor signal BP is smaller than the reference voltage Vr (Vp<Vr) during the time that temperature of the laser diode is stabilizing. The output of the comparator 16b declines until the transistor TR2 turns on. As a result, the voltage across the resistor R1 of the ACC circuit 12 is decided by the corrector current of transistor TR2 and the laser diode current id decreases. In other words, when the backward power (the emission power) increases and the voltage value Vp of the backward power monitor signal BP becomes smaller than the reference voltage Vr (i.e., when the laser diode 11 is about to emit excessively), the transistor TR2 turns on and the laser diode current id is limited to establish the relation Vp=Vr, thereby preventing the excessive emission.

Figure 5:
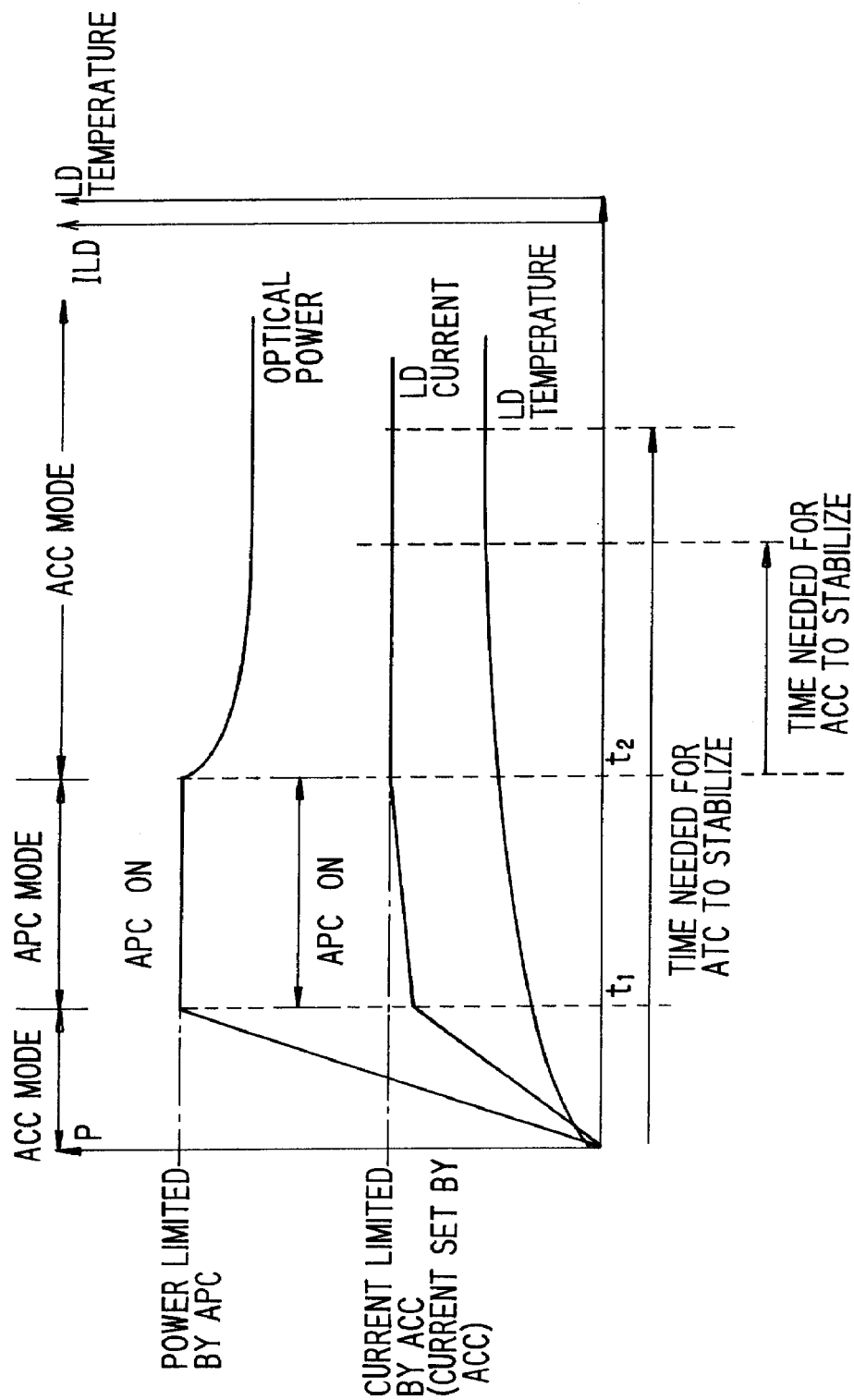
FIG. 5 is a diagram useful in describing operation according to the first embodiment when a laser diode is started up at low temperature.

The operation described above is such that when the laser diode is driven at low temperatures, the laser diode current takes on a large value under ACC before the laser diode temperature rises to the target temperature under ATC, as shown in FIG. 5. As a result, when the laser diode 11 is about to emit light excessively (time $t_1$), the laser diode drive circuit functions in such a manner that the emission power is rendered constant. This is the APC (Automatic Power Control) mode. When the temperature of the laser diode 11 subsequently stabilizes at the set temperature owing to ATC (time $t_2$), the voltage Vp of the backward power monitor signal BP becomes higher than the reference voltage Vr. Consequently, the output of the comparator 16b rises and the transistor TR2 of the current source 16d turns off. As a result, the ACC circuit 12 restores the ACC function and performs control in such a manner that the laser diode current id takes on a current value determined by the resistance ratio of the resistors R2, R3. This is the ACC mode.

This circuit arrangement is advantageous in that it functions to prevent an excessive emission from the laser diode in a case where power is introduced at low temperature and, at the same time, can be employed as an APC circuit as well when it is used with the transistor TR2 in the ON state at times.

(b) Second embodiment

Figure 6:
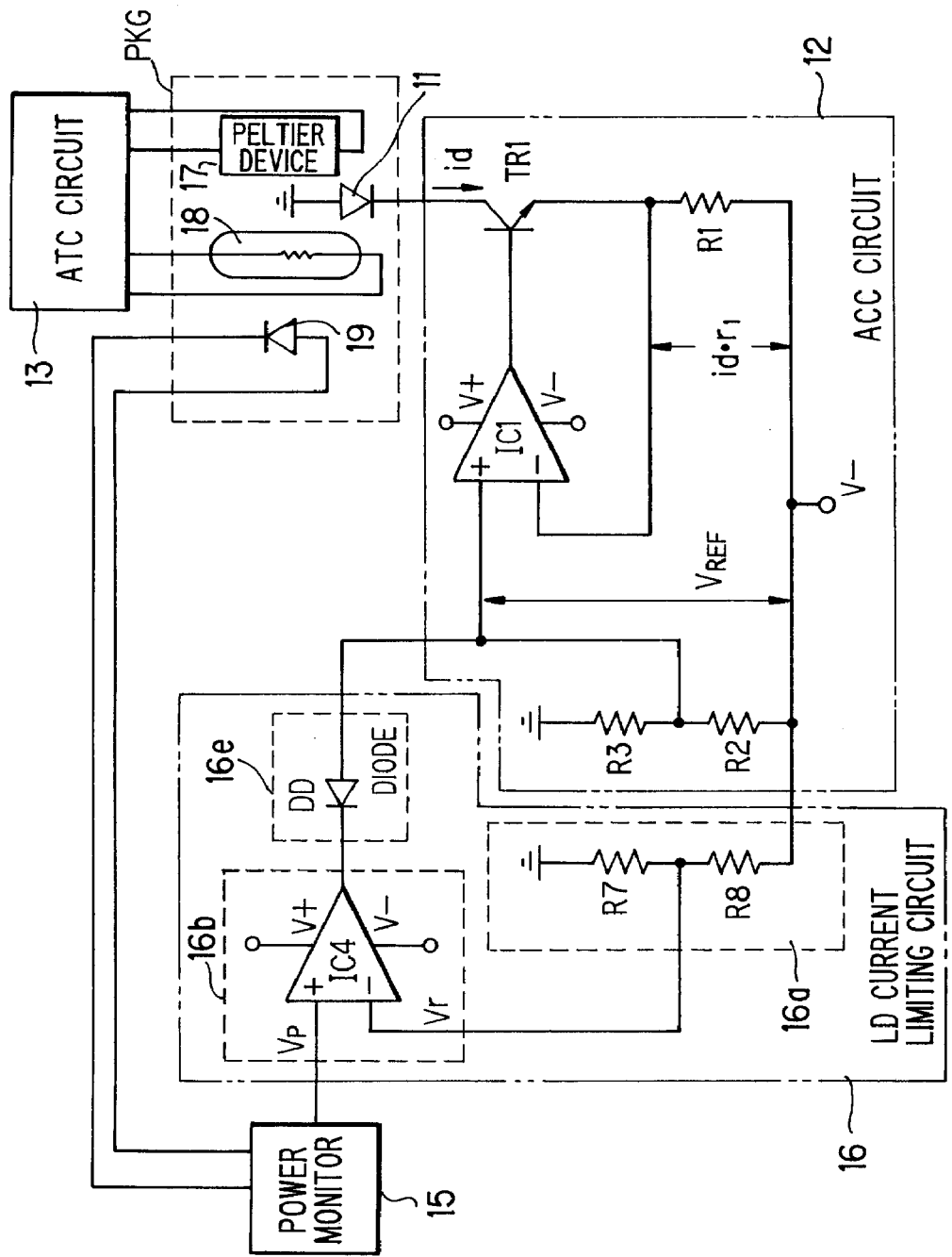
FIG. 6 is a diagram showing a second embodiment in which excessive emission is prevented by detecting emission power.

FIG. 6 is a diagram showing a second embodiment in which excessive emission is prevented by detecting emission power (backward power) of the laser diode 11. Components identical with those shown in FIG. 1 are designated by identical reference characters. Here also the laser diode (LD) 11 is housed in the package PKG along with the Peltier device 17, the thermister 18 for detecting the temperature of the laser diode chip and the PIN photodiode 19 for detecting the backward power (optical intensity) of the laser diode.

Figure 16:
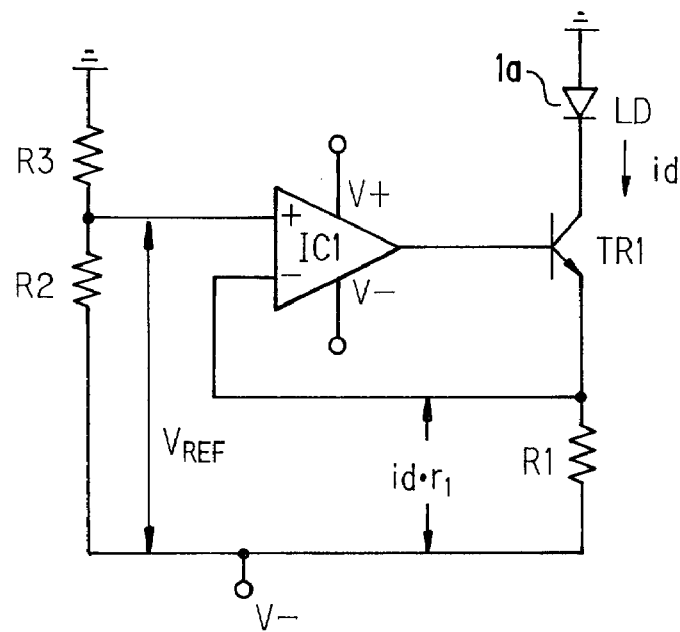
FIG. 16 is a diagram showing an example of an ACC circuit.

The ACC circuit 12, which is for performing control in such a manner that the laser diode current will attain the set current value, has a construction identical with that of the ACC circuit shown in FIG. 16. In addition, the output terminal of a reference voltage reducing circuit (described later) 16e is connected to the non-inverting input terminal of the comparator IC1. If the backward power is less than the set power, the reference voltage reducing circuit 16e does not reduce the reference voltage $V_{REF}$ of the comparator IC1. Consequently, the ACC circuit 12 performs ACC in such a manner that the laser diode current id attains the set current value (=$V_{REF}$/r1). If the backward power is greater than the set power, on the other hand, the reference voltage reducing circuit 16e reduces the reference voltage $V_{REF}$ input to the non-inverting input terminal of the comparator IC1. The ACC circuit 12 performs control in such a manner that the terminal voltage (=id.r1) of the resistor R1 that prevailed at flow of the laser diode current id becomes equal to the reference voltage $V_{REF}$. When the reference voltage decreases, therefore, the laser diode current id is limited to a small value. The ATC circuit 13 performs control so as to render the laser diode temperature constant and has a construction identical with that of the ATC circuit shown in FIG. 17. The power monitor circuit 15 uses the PIN photodiode 19 to output a voltage signal (the backward power monitor signal) conforming to backward power. The laser diode current limiting circuit 16 limits the laser diode current when backward power exceeds the set power.

The laser diode current limiting circuit 16 includes the reference voltage generator 16a for outputting the reference voltage Vr through voltage division by resistors R7, R7, the comparator 16b constituted by an operational amplifier for comparing the voltage Vp dependent upon detected emission power with the reference voltage Vr, and the reference voltage reducing circuit 16e, which is constituted by a diode (DD). The reference voltage reducing circuit 16e is connected across the output terminal of the comparator 16b and the non-inverting input terminal of the comparator IC1 via the diode DD in the polarity shown.

The diode DD is forward biased when the backward power is greater than the set power (Vp<Vr). Consequently, the reference voltage $V_{REF}$ of the comparator IC1 in the ACC circuit 12 takes on a low potential higher than that of the output of comparator 16b by the voltage across the diode, whereby the laser diode current id is limited. If the backward power is less than the set power, on the other hand (Vp≧Vr), the diode DD is reverse biased and, hence, the reference voltage VREF of the comparator IC1 of ACC circuit 12 takes on a large value obtained by voltage division by the resistors R2, R3. The ACC circuit 12 performs control in such a manner that id.r1 becomes equal to the reference voltage $V_{REF}$, i.e., in such a manner that the laser diode current id becomes equal to $V_{REF}$/r1.

By utilizing the fact that the forward power of the laser diode and the backward power BP of the laser diode are proportionally related, the reference voltage Vr is set in advance so as to attain a backward power monitor signal voltage corresponding to that which would prevail when the forward power is some multiple of the usual value.

When power is introduced to the laser diode drive circuit at low temperatures in the arrangement described above, the voltage Vp of the backward power monitor signal BP is smaller than the reference voltage Vr (Vp<Vr) during the time that temperature of the laser diode is stabilizing. The output of the comparator 16b declines until the diode DD turns on, and the laser diode current id is decided not by the resistance dividing ratio but by a low potential higher than that of the output of comparator 16b by the voltage across the diode.

More specifically, when the backward power (emission power) rises and the voltage value Vp of the backward power monitor signal BP falls below the reference voltage Vr (i.e., when the laser diode 11 is about to emit light excessively), the diode DD turns on (is forward biased) to limit the laser diode current id. This is the APC (Automatic Power Control) mode. When the temperature of the laser diode 11 subsequently stabilizes at the set temperature owing to ATC, the voltage Vp of the backward power monitor signal BP becomes higher than the reference voltage Vr. Consequently, the output of the comparator 16b rises, the diode DD turns off (is reversed biased) and the laser diode current id takes on a current value determined by the resistance ratio of the resistors R2, R3. This is the ACC mode.

This circuit arrangement is advantageous in that it functions to prevent an excessive emission from the laser diode in a case where power is introduced at low temperature and, at the same time, can be employed as an APC circuit as well when it is used with the diode DD in the ON state at times.

Figure 7:
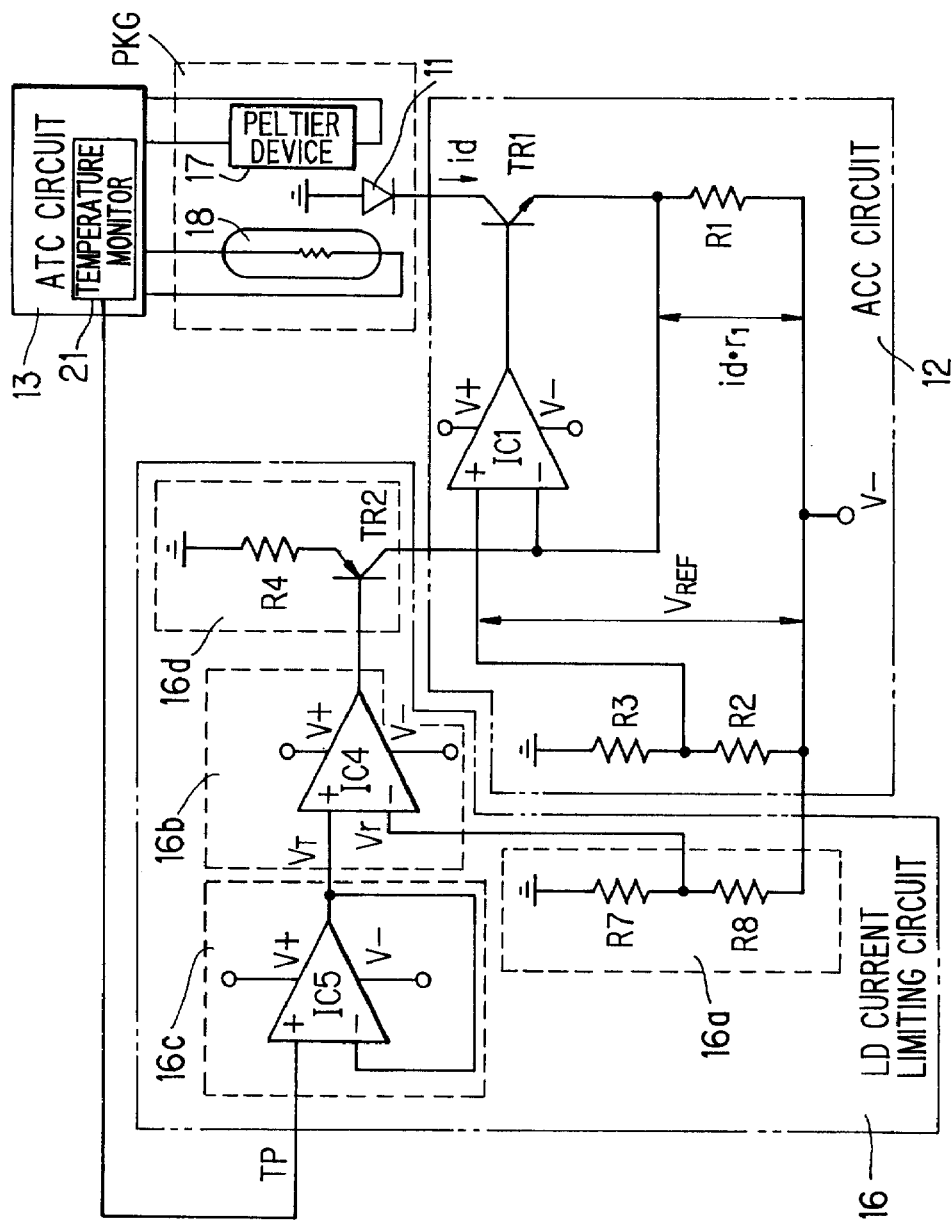
FIG. 7 is a diagram showing the first embodiment in which excessive emission is prevented by detecting laser diode temperature.

(C) Embodiments for preventing excessive emission by detecting laser diode temperature (a) First embodiment FIG. 7 is a diagram showing the construction of a first embodiment in which excessive emission is prevented by detecting the temperature of the laser diode chip. This embodiment has a construction similar to that of the embodiment of FIG. 4 in which an excessive emission is prevented by detecting emission power. Components identical with those shown in FIG. 4 are designated by identical reference characters. This embodiment differs in the following respects:

(1) The power monitor circuit 15 of FIG. 4 is deleted.
(2) The input to the laser diode current limiting circuit 16 is a signal (a temperature monitor signal TP), which conforms to the laser diode temperature, output by the temperature monitor circuit 21 provided in the ATC circuit 13.
(3) The reference voltage Vr is set to a voltage that corresponds to a temperature several degrees Centigrade lower than the target temperature of ATC.

The chip temperature of the laser diode 11 is monitored by the temperature monitoring circuit 21, the temperature monitor signal TP conforming to this temperature is input to the voltage follower 16c, and a voltage $V_T$ conforming to the laser diode temperature enters the comparator 16b from the voltage follower 16c. The comparator 16b compares the reference voltage Vr, which is decided by the resistors R7, R8, with the voltage $V_T$ conforming to the laser diode temperature. The reference voltage Vr is set to a voltage value output by the temperature monitoring circuit 21 at a temperature several degrees Centigrade lower than the target temperature of ATC. Accordingly, when power is introduced to the laser diode drive circuit at low temperatures, the voltage $V_T$ output by the temperature monitoring circuit 21 takes on a potential in the negative direction with respect to the reference voltage Vr ($V_T$<Vr) during the time that the temperature of the laser diode is stabilizing (i.e., until the set temperature is attained). During the time that $V_T$<Vr holds, the output of the comparator 16b declines until the transistor TR2 of the current source 16d is capable of turning on. The current source 16d passes a current into the resistor R1 of the ACC circuit 12. Consequently, the inverting input of the comparator IC1 becomes greater than $V_{REF}$, which is at the non-inverting input terminal of the comparator, the transistor TR1 turns off and the laser diode current id becomes zero. Thus, during the time that the laser diode 11 is at a temperature that would result in an excessive emission, the transistor TR2 is rendered conductive to reduce the laser diode current id, as a result of which the laser diode 11 does not emit light excessively. Damage to the laser diode 11 is thus prevented and so is deterioration of the laser diode characteristics. This is the ACC termination mode.

If the temperature of the laser diode 11 subsequently rises owing to ATC and the voltage VT output by the temperature monitoring circuit 21 attains a potential higher than that of the reference voltage Vr, the output of the comparator 16b becomes positive and the transistor TR2 turns off. As a result, the ACC circuit 12 subsequently restores the ACC function so that the laser diode current id will take on a current value conforming to the reference voltage $V_{REF}$ decided by the resistors R2, R3. This is the ACC mode.

Figure 8:
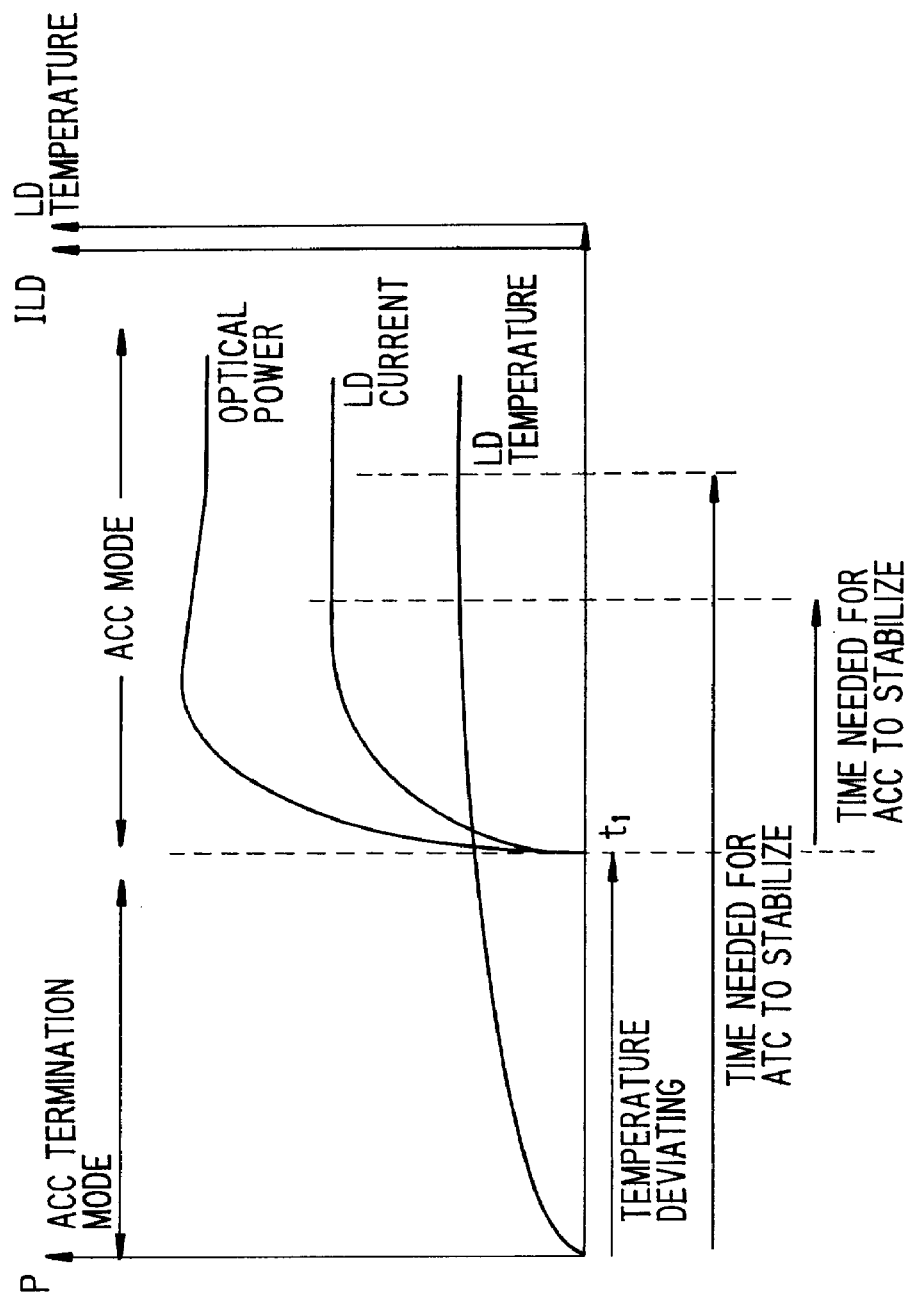
FIG. 8 is a diagram useful in describing operation according to the first embodiment of FIG. 7 when a laser diode is started up at low temperature.

The operation described above is such that when the laser diode is driven at low temperatures, the laser diode current id is zero and so is the emission power (optical output) of the laser diode until the laser diode temperature rises to a temperature several degrees Centigrade lower than the target temperature of ATC, as shown in FIG. 8. This is the ACC termination mode. In other words, during the time that the laser diode is at a temperature that would result in an excessive emission, the laser diode current id is zero and an excessive emission from the laser diode is prevented. When the temperature of the laser diode 11 subsequently rises under ATC and attains a temperature several degrees Centigrade lower than the target temperature of ATC (time $t_1$), the ACC circuit 12 restores the ACC function and performs control in such a manner that the laser diode current id takes on a current value determined by the resistance ratio of the resistors R2, R3. This is the ACC mode. Since ACC is thus performed after the temperature rises, an excessive laser diode emission does not occur. It should be noted that although the laser diode current id is made zero in the ACC termination mode in the foregoing description, this is not an essential requisite. In other words, it will suffice to pass such a laser diode current that does not cause the laser diode to emit light excessively.

By virtue of the foregoing operation, the laser diode current is forcibly reduced in a region wherein an excessive emission is most likely to occur immediately after the introduction of power at low temperature.

(b) Second embodiment

Figure 9:
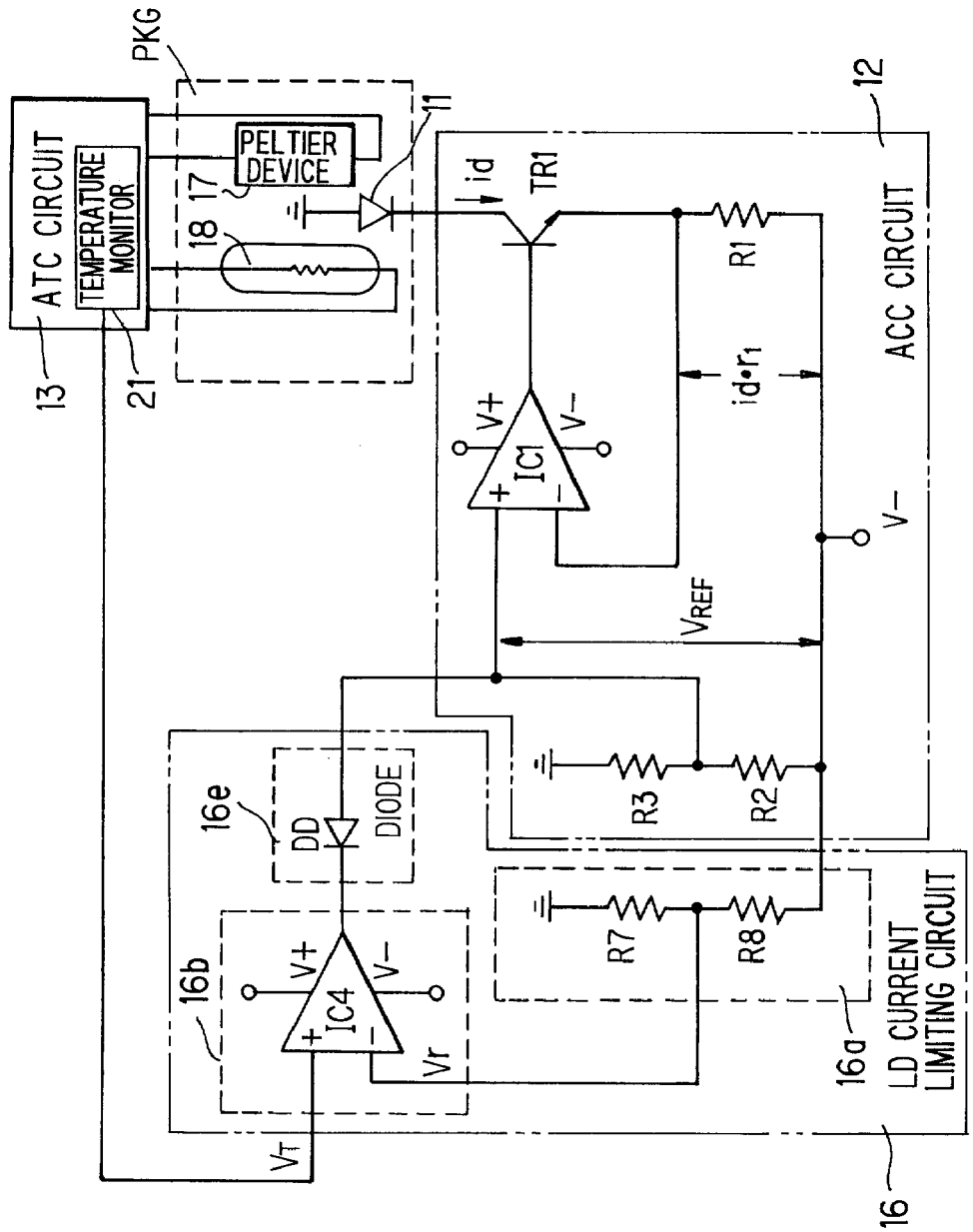
FIG. 9 is a diagram showing the second embodiment in which excessive emission is prevented by detecting laser diode temperature.

FIG. 9 is a diagram showing the construction of a second embodiment in which excessive emission is prevented by detecting the temperature of the laser diode chip. This embodiment has a construction similar to that of the embodiment of FIG. 6 in which an excessive emission is prevented by detecting emission power. Components identical with those shown in FIG. 6 are designated by identical reference characters. This embodiment differs in the following respects:

(1) The power monitor circuit 15 of FIG. 6 is deleted.
(2) The input to the laser diode current limiting circuit 16 (the non-inverting input terminal of the comparator 16b) is the voltage $V_T$, which conforms to the laser diode temperature, output by the temperature monitor circuit 21 provided in the ATC circuit 13.
(3) The reference voltage Vr is set to a voltage that corresponds to a temperature several degrees Centigrade lower than the target temperature of ATC.

The chip temperature of the laser diode 11 is monitored by the temperature monitoring circuit 21 and the voltage $V_T$ conforming to the laser diode temperature enters the comparator 16b. The comparator 16b compares the reference voltage Vr, which is decided by the resistors R7, R8, with the voltage $V_T$ conforming to the laser diode temperature. The reference voltage Vr is set to a voltage value output by the temperature monitoring circuit 21 at a temperature several degrees Centigrade lower than the target temperature of ATC. Accordingly, when power is introduced to the laser diode drive circuit at low temperatures, the voltage $V_T$ output by the temperature monitoring circuit 21 takes on a potential in the negative direction with respect to the reference voltage Vr ($V_T$<Vr) during the time that temperature of the laser diode is stabilizing (i.e., until the set temperature is attained). During the time that $V_T$<Vr holds, the output of the comparator 16b declines until the diode DD of the current source 16d is capable of turning on. The laser diode current id is decided not by the resistance dividing ratio but by a low potential higher than that of the output of comparator 16b by the voltage across the diode. Thus the laser diode current is limited to such a current value that will not result in excessive emission.

Thus, during the time that the laser diode 11 is at a low temperature that would result in an excessive emission, the diode DD is rendered conductive to reduce the laser diode current id, as a result of which the laser diode 11 does not emit excessively. Damage to the laser diode 11 is thus prevented and so is deterioration of the laser diode characteristics. This is the ACC termination mode.

If the temperature of the laser diode 11 subsequently rises owing to ATC and the voltage VT output by the temperature monitoring circuit 21 attains a potential higher than that of the reference voltage Vr, the output of the comparator 16b becomes positive and the diode DD turns off. As a result, the ACC circuit 12 subsequently restores the ACC function so that the laser diode current id will take on a current value conforming to the reference voltage $V_{REF}$ decided by the resistors R2, R3. This is the ACC mode.

Figure 10:
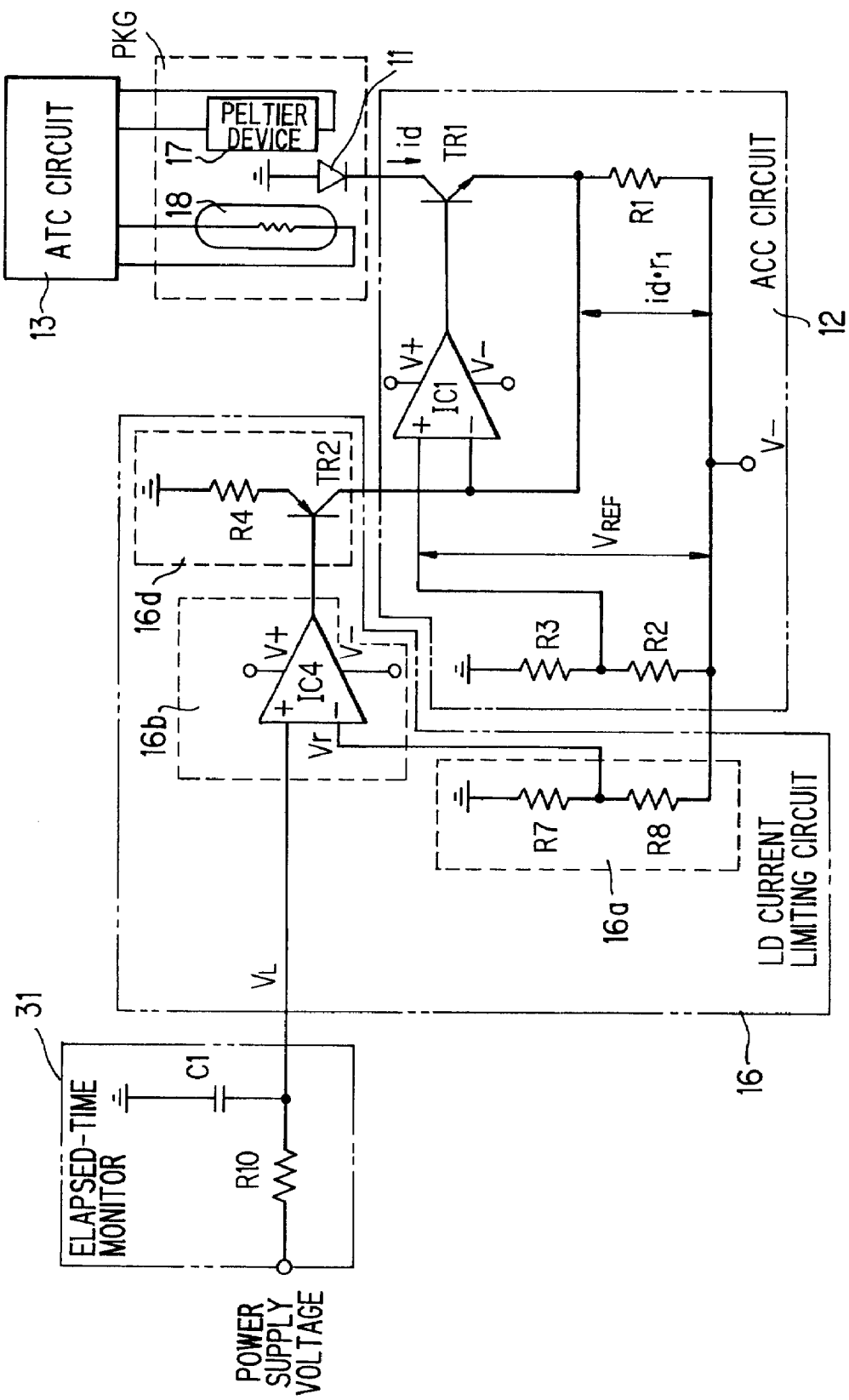
FIG. 10 is a diagram showing the first embodiment in which excessive emission is prevented by monitoring time that elapses from introduction of power.

(D) Embodiments for preventing excessive emission by monitoring time that elapses from introduction of power (a) First embodiment FIG. 10 is a diagram showing the construction of first embodiment in which excessive emission is prevented by monitoring time that elapses from introduction of power. This embodiment has a construction similar to that of the embodiment of FIG. 4 in which an excessive emission is prevented by detecting emission power. Components identical with those shown in FIG. 4 are designated by identical reference characters. This embodiment differs in the following respects:

(1) The power monitor circuit 15 and voltage follower 16c of FIG. 4 is deleted.

(2) The elapsed-time monitor circuit 31 is provided for monitoring time that elapses from introduction of power and the input to the laser diode current limiting circuit 16 (the non-inverting terminal of the comparator 16b) is a reference voltage $V_L$, which conforms to elapsed time, output by the elapsed-time monitor circuit 31.

(3) A voltage corresponding to the time needed for the laser diode temperature to attain a substantially constant temperature by ATC following the introduction of power is set as a reference voltage Vr.

The elapsed-time monitor circuit 31 is constituted by an integrator circuit composed of a resistor R10 and a capacitor C1 and has a power supply voltage applied thereto. If power is introduced to the laser diode drive at low temperature, the capacitor terminal voltage (output voltage $V_L$) rises exponentially at a time constant R10·C1 from the moment power introduction. The comparator 16b compares the reference voltage Vr, which is decided by the resistor R7, R8, with the reference voltage $V_L$ that conforms to elapsed time measured from the moment of power introduction. The reference voltage Vr is a voltage that corresponds to the time needed for the laser diode temperature to attain a substantially constant temperature by ATC following the introduction of power. Consequently, the voltage $V_L$ output by the elapsed-time monitor circuit 31 takes on a potential in the negative direction with respect to the reference voltage Vr ($V_L$<Vr) during the time that the temperature of the laser diode 11 is stabilizing.

During the time that $V_L$<Vr holds, the output of the comparator 16b declines until the transistor TR2 of the current source 16d is capable of turning on. The current source 16d passes a current into the resistor R1 of the ACC circuit 12. Consequently, the inverting input of the comparator IC1 becomes greater than $V_{REF}$, which is at the non-inverting input terminal of the comparator, the transistor TR1 turns off and the laser diode current id becomes zero. Thus, the transistor TR2 is driven into conduction to reduce the laser diode current id until the laser diode temperature becomes substantially constant, i.e., until the elapse of a period of time in which an excessive emission from the laser diode 11 is possible. Damage to the laser diode 11 is thus prevented and so is deterioration of the laser diode characteristics. This is the ACC termination mode.

If the temperature of the laser diode 11 subsequently rises and attains a substantially constant temperature owing to ATC, the voltage $V_L$ output by the elapsed-time monitor circuit 31 attains a potential higher than that of the reference voltage Vr. If the relation $V_L$>Vr is established, the output of the comparator 16b becomes positive and the transistor TR2 turns off. As a result, the ACC circuit 12 subsequently restores the ACC function so that the laser diode current id will take on a current value conforming to the reference voltage $V_{REF}$ decided by the resistors R2, R3. This is the ACC mode.

Figure 11:
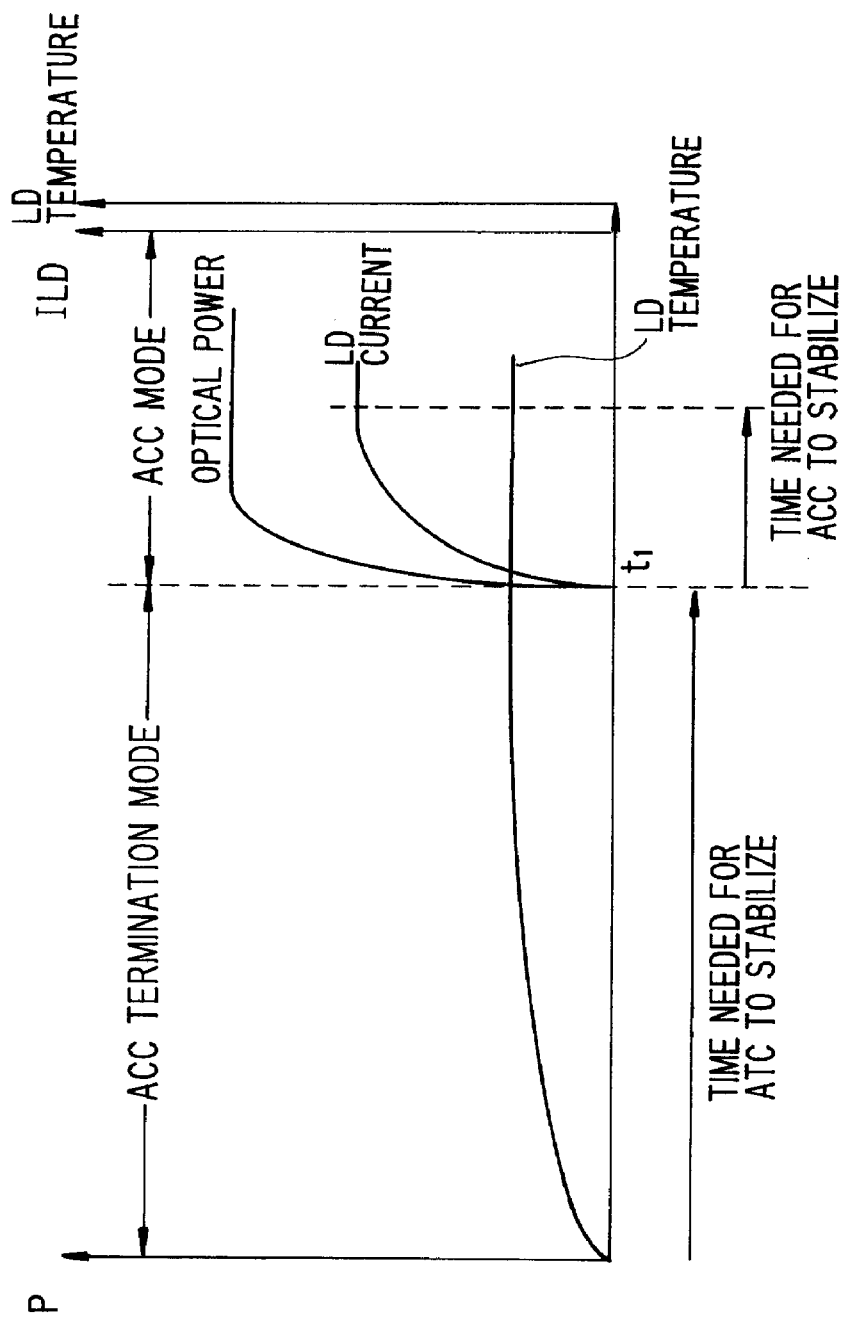
FIG. 11 is a diagram useful in describing operation at low-temperature start-up of a laser diode in a configuration in which time that elapses from introduction of power is monitored.

The operation described above is such that when the laser diode is driven at low temperatures, the laser diode current id is zero and so is the emission power of the laser diode until the laser diode temperature stabilizes, as shown in FIG. 11. This is the ACC termination mode. In other words, during the time that the laser diode is at a low temperature that would result in an excessive emission, the laser diode current id is zero and an excessive emission from the laser diode is prevented. When the temperature of the laser diode 11 subsequently stabilizes under ATC (time $t_1$), the ACC circuit 12 restores the ACC function and performs control in such a manner that the laser diode current id takes on a current value determined by the resistance ratio of the resistors R2, R3. This is the ACC mode. Since ACC is thus performed after the temperature rises, an excessive laser diode emission does not occur. It should be noted that although the laser diode current id is made zero in the ACC termination mode in the foregoing description, this is not an essential requisite. In other words, it will suffice to pass such a laser diode current that does not cause the laser diode to emit light excessively.

By virtue of the foregoing operation, the ACC circuit 12 does not operate for several seconds following the introduction of power. At low-temperature start-up, therefore, first the ATC circuit 13 functions to stabilize temperature. Once temperature has stabilized, the ACC circuit 12 begins operating. This makes it possible to prevent an excessive emission from the laser diode.

(b) Modification of first embodiment

Figure 12:
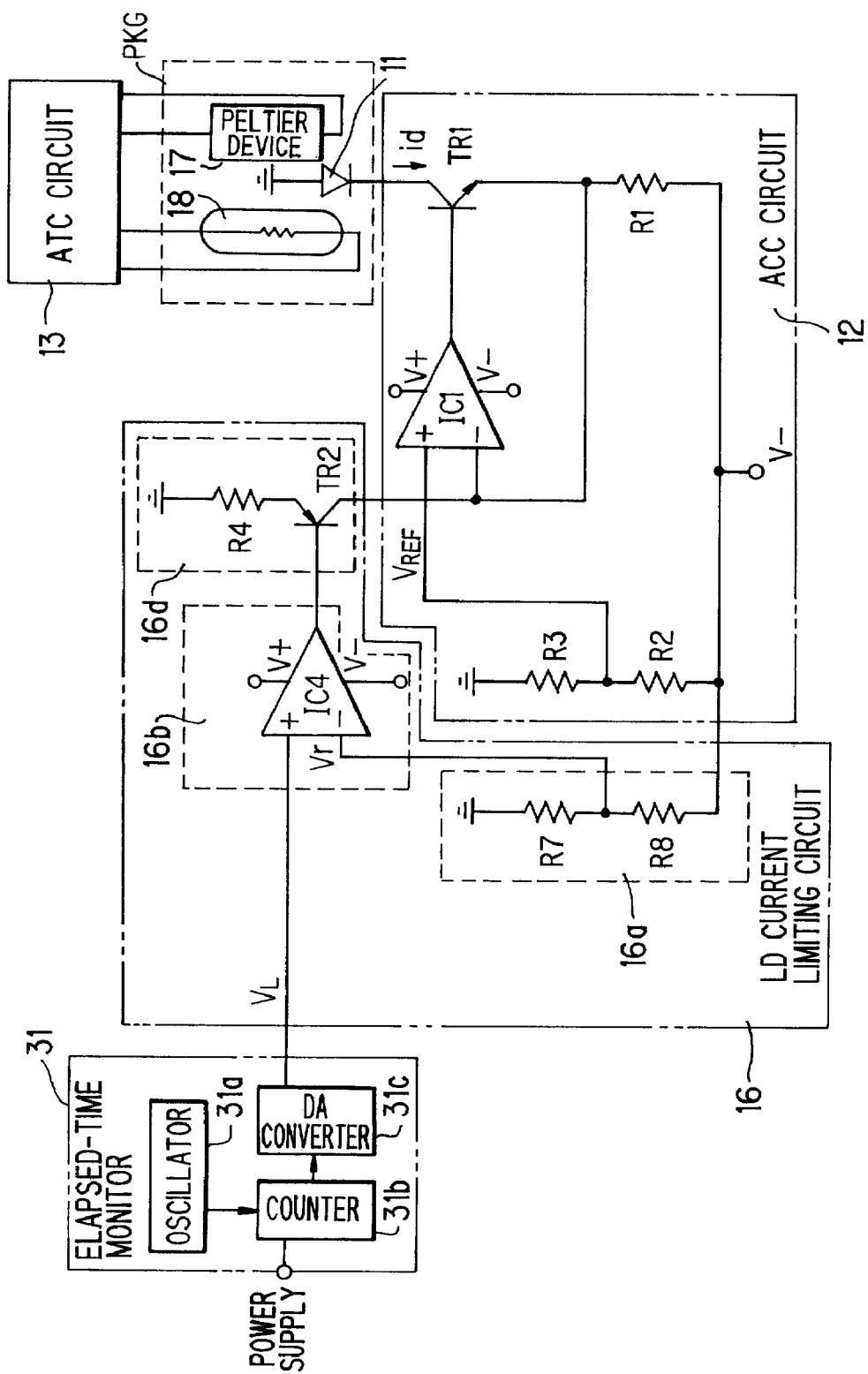
FIG. 12 is a diagram showing a modification of the first embodiment.

FIG. 12, which illustrates a modification of the first embodiment, is an example in which the circuit 31 for monitoring elapse of time from introduction of power is constituted by a counter and a DA converter. More specifically, the elapsed-time monitor circuit 31 includes an oscillator 31a which oscillates at a constant frequency, a counter 31b and a DA converter 31c for converting the digital count from the counter 31b to an analog signal. The counter 31b counts pulses output by the oscillator 31a after power is introduced, and the DA converter 31c subjects the count from the counter to digital-to-analog conversion to output a voltage signal $V_L$ that increases in proportion to elapsed time.

(c) Second embodiment

Figure 13:
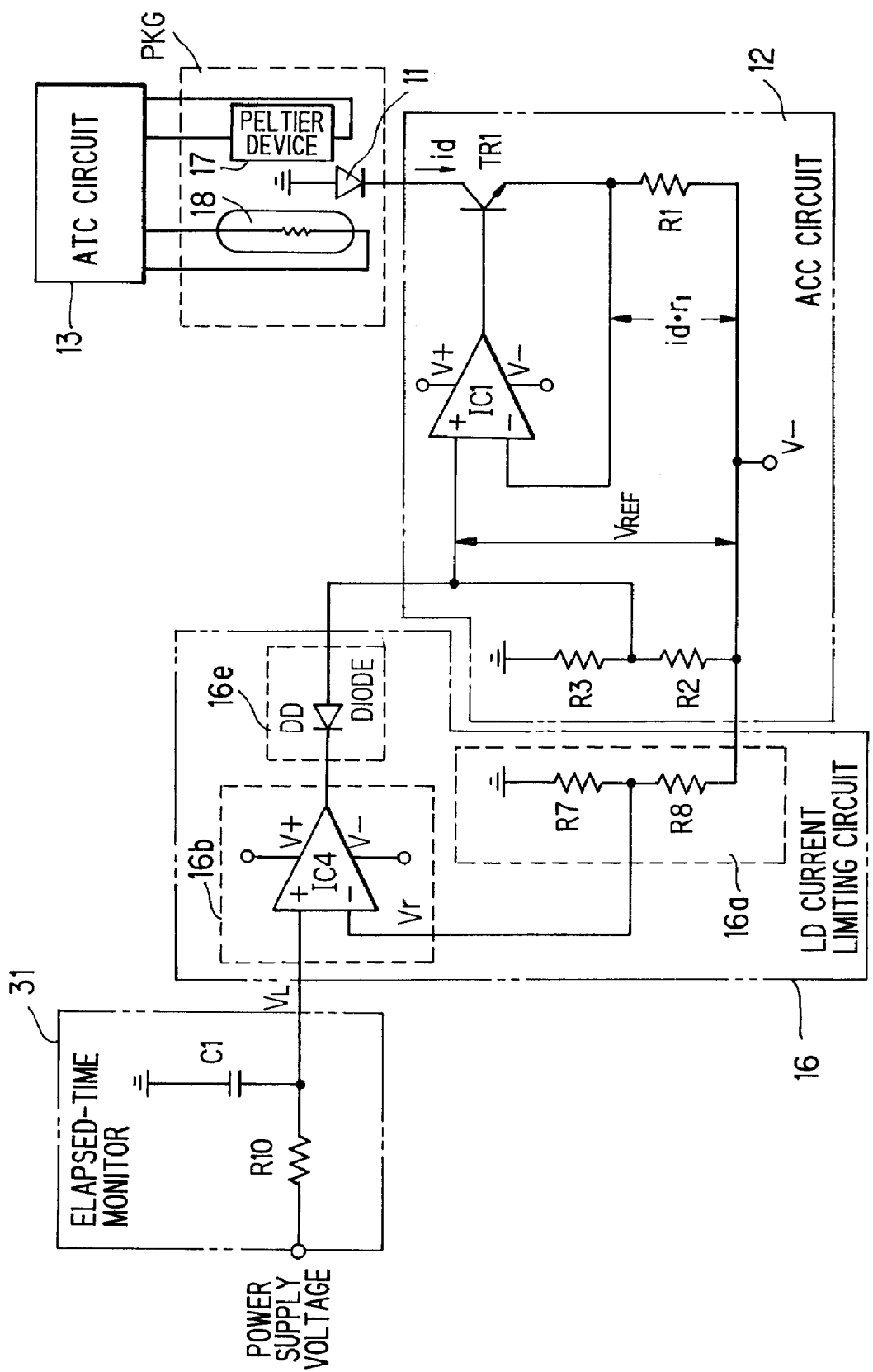
FIG. 13 is a diagram showing the second embodiment in which excessive emission is prevented by monitoring time that elapses from introduction of power is monitored.

FIG. 13 is a diagram showing the construction of a second embodiment in which excessive emission is prevented by monitoring elapse of time from introduction of power. This embodiment has a construction similar to that of the embodiment of FIG. 6 in which an excessive emission is prevented by detecting emission power. Components identical with those shown in FIG. 6 are designated by identical reference characters. This embodiment differs in the following respects:

(1) The power monitor circuit 15 of FIG. 6 is deleted.
(2) The elapsed-time monitor circuit 31 is provided for monitoring time that elapses from introduction of power and the input to the laser diode current limiting circuit 16 (the non-inverting terminal of the comparator 16b) is a reference voltage $V_L$, which conforms to elapsed time, output by the elapsed-time monitor circuit 31.
(3) A voltage corresponding to the time needed for the laser diode temperature to attain a substantially constant temperature by ATC following the introduction of power is set as a reference voltage Vr.

The elapsed-time monitor circuit 31 is constituted by an integrator circuit composed of a resistor R10 and a capacitor C1 and has a power supply voltage applied thereto. If power is introduced to the laser diode drive at low temperature, the capacitor terminal voltage (output voltage $V_L$) rises exponentially at a time constant R10.C1 from the moment of power introduction. The comparator 16b compares the reference voltage Vr, which is decided by the resistor R7, R8, with the reference voltage $V_L$ that conforms to elapsed time measured from the moment of power introduction. The reference voltage Vr is a voltage that corresponds to the time needed for the laser diode temperature to attain a substantially constant temperature by ATC following the introduction of power. Consequently, the voltage $V_L$ output by the elapsed-time monitor circuit 31 takes on a potential in the negative direction with respect to the reference voltage Vr ($V_L$<Vr) during the time that the temperature of the laser diode 11 is stabilizing.

During the time that $V_L$<Vr holds, the output of the comparator 16b declines until the diode DD is capable of turning on. The laser diode current id is decided by a low potential higher than that of the output of comparator 16b by the voltage across the diode, whereby the laser diode current id is limited. Thus, the diode DD is driven into conduction to reduce the laser diode current id during the period of low temperature over which it is likely that the laser diode 11 will emit light excessively. This is the ACC termination mode.

If the temperature of the laser diode 11 subsequently rises and attains a substantially constant temperature owing to ATC, the voltage $V_L$ output by the elapsed-time monitor circuit 31 attains a potential higher than that of the reference voltage Vr. If the relation $V_L$>Vr is established, the output of the comparator 16b becomes positive and the diode DD turns off. As a result, the ACC circuit 12 subsequently restores the ACC function so that the laser diode current id will take on a current value conforming to the reference voltage $V_{REF}$ decided by the resistors R2, R3. This is the ACC mode.

By virtue of the foregoing operation, the ACC circuit 12 does not operate for several seconds following the introduction of power. At low-temperature start-up, therefore, first the ATC circuit 13 functions to stabilize temperature. Once temperature has stabilized, the ACC circuit 12 begins operating. This makes it possible to prevent an excessive emission from the laser diode.

(d) Modification of second embodiment

Figure 14:
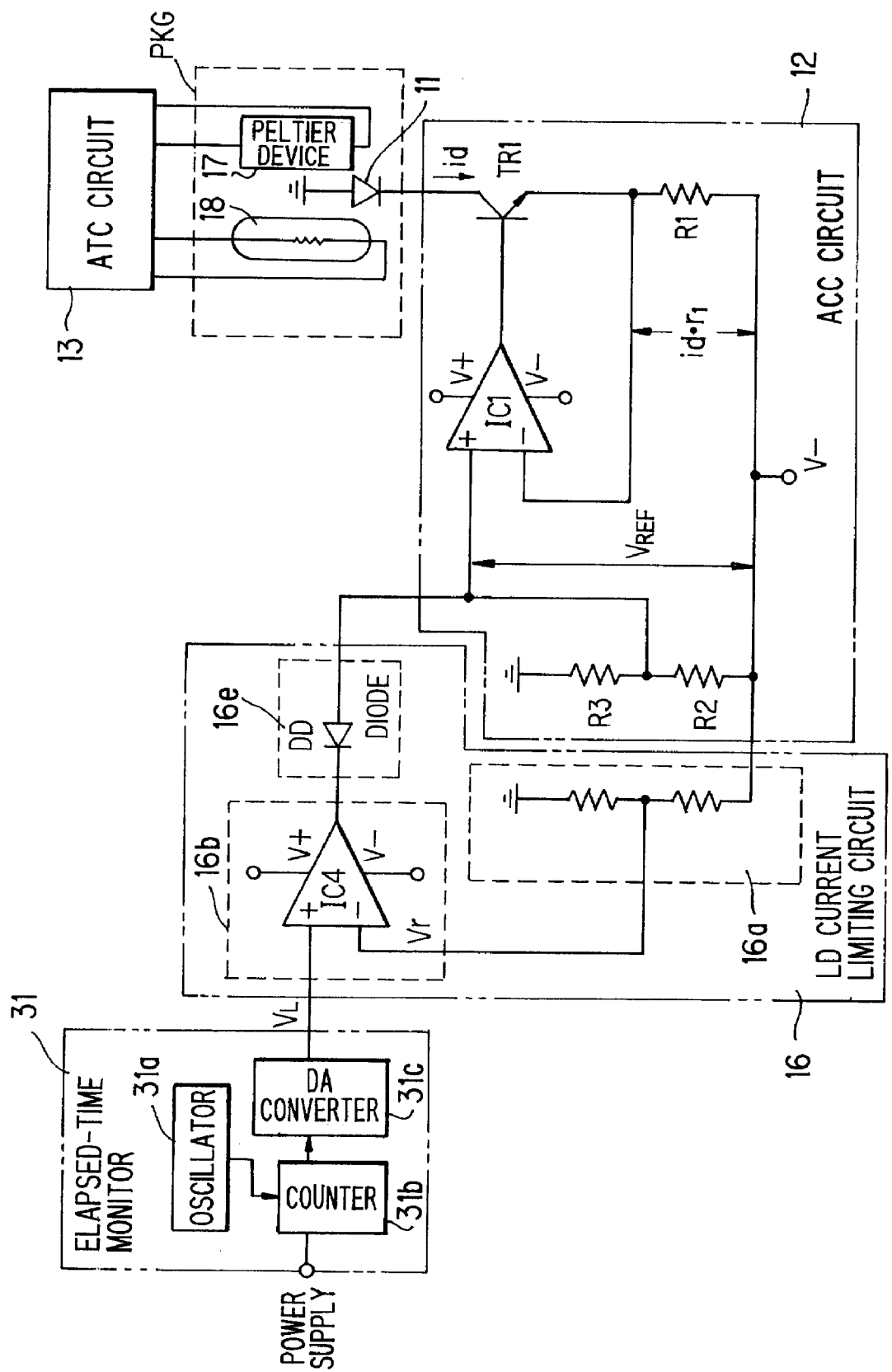
FIG. 14 is a diagram showing a modification of the second embodiment.
Figure 15:
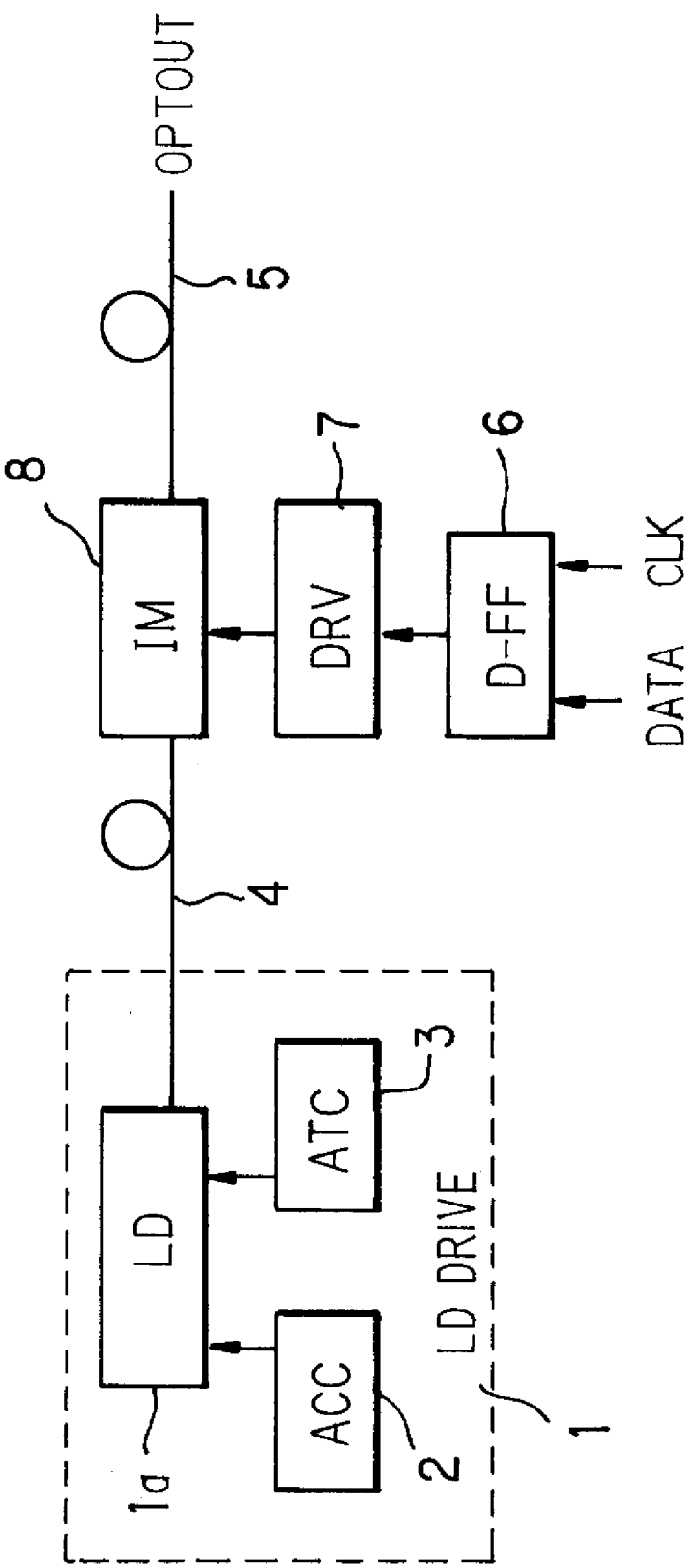
FIG. 15 is a block diagram of an optical transmitter.

FIG. 14, which illustrates a modification of the second embodiment, is an example in which the circuit 31 for monitoring elapse of time from introduction of power is constituted by a counter and a DA converter. More specifically, the elapsed-time monitor circuit 31 includes the oscillator 31a which oscillates at a constant frequency, the counter 31b and the DA converter 31c for converting the digital count from the counter 31b to an analog signal. The counter 31b counts pulses output by the oscillator 31a after power is introduced, and the DA converter 31c subjects the count from the counter to digital-to-analog conversion to output a voltage signal $V_L$ that increases in proportion to elapsed time.

Thus, in accordance with the present invention, the power (backward power) of a laser diode is monitored and the laser diode current is limited when the backward power exceeds a set value. When the laser diode temperature subsequently rises and the backward power falls below the set power, automatic current control is applied so that the laser diode will take on a set current value. As a result, the laser diode current can be limited when the laser diode is at a low temperature. This makes it possible to prevent an excessive light emission from the laser diode so that the laser diode will not destroyed or suffer a deterioration in characteristics.

In accordance with the present invention, laser diode temperature is monitored and the laser diode current is limited when the laser diode temperature is less than a set temperature. When the laser diode temperature rises and surpasses the set temperature, automatic current control is applied so that the laser diode will take on the set current value. As a result, an excessive emission from the laser diode at low temperature can be prevented. This assures that neither damage to the laser diode nor deterioration of the laser diode characteristics will occur.

In accordance with the present invention, time that elapses from introduction of power is monitored. If the elapsed time has not exceeded a set time, the laser diode current is limited to zero or to a low current value. After the elapsed time exceeds the set time, automatic current control is applied so that the laser diode current will become equal to the set current value. As a result, the set time is made the time required for the laser diode temperature to attain a substantially constant temperature after power is introduced (i.e., the time needed for the laser diode temperature to stabilize). As a result, the laser diode current is limited when the laser diode is at a low temperature. This makes it possible to prevent an excessive emission of light from the laser diode and assure that neither damage to the laser diode nor deterioration of the laser diode characteristics will occur.

As many apparently widely different embodiments of the present invention can be made without departing from the spirit and scope thereof, it is to be understood that the invention is not limited to the specific embodiments thereof except as defined in the appended claims.

What is claimed is:

1. A laser diode protecting circuit of a laser diode drive having an automatic current control circuit for performing control in such a manner that laser diode current attains a set current value, comprising:
   a power monitor circuit for monitoring emission power of a laser diode; and
   a laser diode current limiting circuit for halting automatic current control to limit laser diode current when the emission power exceeds a set value, and restoring automatic current control to make the laser diode current equal to the set current value when the emission power falls below the set value.

2. The laser diode protecting circuit according to claim 1, wherein the automatic current control circuit includes:

a series circuit comprising the laser diode, a semiconductor switch and a resistor; and a control circuit for controlling said semiconductor switch in such a manner that terminal voltage of said resistor attains a set voltage, whereby the laser diode current is made the set current value; and said laser diode current limiting circuit includes:

a comparator circuit for comparing the emission power and the set value; and a control circuit for passing a current other than the laser diode current into said resistor and making the laser diode current less than the set current value when the emission power exceeds the set value, and halting said passing of current and making the laser diode current the set current value when the emission power falls below the set value.

3. The laser diode protecting circuit according to claim 1, wherein the automatic current control circuit includes:

a series circuit comprising the laser diode, a semiconductor switch and a resistor; and a control circuit for controlling said semiconductor switch in such a manner that terminal voltage of said resistor attains a set voltage, whereby the laser diode current is made the set current value; and said laser diode current limiting circuit includes:

a comparator circuit for comparing the emission power and the set value; and a control circuit for reducing the set voltage value and making the laser diode current less than the set current value when the emission power exceeds the set value, and restoring the set voltage value to a normal value and making the laser diode current the set current value when the emission power falls below the set value.

4. A laser diode protecting circuit of a laser diode drive having an automatic current control circuit for performing control in such a manner that laser diode current attains a set current value, comprising:

a temperature monitor circuit for monitoring temperature of a laser diode; and a laser diode current limiting circuit for halting automatic current control and limiting laser diode current when the temperature of the laser diode is less than a set temperature, and restoring automatic current control and making the laser diode current equal to the set current value when the temperature of the laser diode is greater than the set temperature.

5. The laser diode protecting circuit according to claim 4, wherein the automatic current control circuit includes:

a series circuit comprising the laser diode, a semiconductor switch and a resistor; and a control circuit for controlling said semiconductor switch in such a manner that terminal voltage of said resistor attains a set voltage, whereby the laser diode current is made the set current value; and said laser diode current limiting circuit includes:

a comparator circuit for comparing the laser diode temperature and the set value; and a control circuit for passing a current other than the laser diode current into said resistor and making the laser diode current less than the set current value or zero when the laser diode temperature is less than the set value, and halting said passing of current and making the laser diode current the set current value when the laser diode temperature exceeds the set value.

6. The laser diode protecting circuit according to claim 4, wherein the automatic current control circuit includes:

a series circuit comprising the laser diode, a semiconductor switch and a resistor; and a control circuit for controlling said semiconductor switch in such a manner that terminal voltage of said resistor attains a set voltage, whereby the laser diode current is made the set current value; and said laser diode current limiting circuit includes:

a comparator circuit for comparing the laser diode temperature and the set value; and a control circuit for reducing the set voltage value and making the laser diode current less than the set current value or zero when the laser diode temperature is less than the set value, and restoring the set voltage value to a normal value and making the laser diode current the set current value when the laser diode temperature exceeds the set value.

7. A laser diode protecting circuit of a laser diode drive having an automatic current control circuit for performing control in such a manner that laser diode current attains a set current value, comprising:

an elapsed-time monitor circuit for monitoring time that elapses from introduction of power; and a laser diode current limiting circuit for halting automatic current control and limiting laser diode current when time that elapses from introduction of power has not attained a set time, and restoring automatic current control to make the laser diode current equal to the set current value when the time that elapses from introduction of power has attained the set time.

8. The laser diode protecting circuit according to claim 7, wherein the automatic current control circuit includes:

a series circuit comprising the laser diode, a semiconductor switch and a resistor; and a control circuit for controlling said semiconductor switch in such a manner that terminal voltage of said resistor attains a set voltage, whereby the laser diode current is made the set current value; and said laser diode current limiting circuit includes:

a comparator circuit for comparing the elapsed time and the set time; and a control circuit for passing a current other than the laser diode current into said resistor and making the laser diode current less than the set current value or zero when the elapsed time has not attained the set time, and halting said passing of current and making the laser diode current the set current value when the elapsed time has attained the set time.

9. The laser diode protecting circuit according to claim 7, wherein the automatic current control circuit includes:

a series circuit comprising the laser diode, a semiconductor switch and a resistor; and a control circuit for controlling said semiconductor switch in such a manner that terminal voltage of said resistor attains a set voltage, whereby the laser diode current is made the set current value; and said laser diode current limiting circuit includes:

a comparator circuit for comparing the elapsed time and the set time; and a control circuit for reducing the set voltage value and making the laser diode current less than the set current value or zero when the elapsed time has not attained the set time, and restoring the set voltage value to a normal value and making the laser diode current the set current value when the elapsed time has attained the set time.

* * * * *